United States Patent
Shikh-Bahaei et al.

(10) Patent No.: US 7,095,811 B1
(45) Date of Patent: Aug. 22, 2006

(54) APPARATUS AND METHOD FOR SECONDARY SYNCHRONIZATION CHANNEL DETECTION IN A 3GPP WCDMA RECEIVER

(75) Inventors: Mohammad Reza Shikh-Bahaei, London (GB); Karim Nassiri-Toussi, Belmont, CA (US); Ali D. Pirooz, Fremont, CA (US)

(73) Assignee: National Semiconductor Corporation, Santa Clara, CA (US)

(*) Notice: Subject to any disclaimer, the term of this patent is extended or adjusted under 35 U.S.C. 154(b) by 694 days.

(21) Appl. No.: 10/232,851

(22) Filed: Aug. 31, 2002

(51) Int. Cl.
*H03D 1/00* (2006.01)
*H03M 13/00* (2006.01)

(52) U.S. Cl. .................. 375/340; 714/784
(58) Field of Classification Search .......... 375/340, 375/130, 142, 341, 147; 370/335, 342, 350; 714/784
See application file for complete search history.

(56) References Cited

U.S. PATENT DOCUMENTS 6,563,436 B1 * 5/2003 Fimoff et al. .............. 341/50

2002/0057664 A1 * 5/2002 Sarkar .................. 370/342
2004/0223517 A1 * 11/2004 Rimi et al. .............. 370/509

* cited by examiner

Primary Examiner—Khai Tran

(57) ABSTRACT

A pipelined cell search apparatus comprises a secondary search stage that receives a secondary synchronization channel (S-SCH) signal. The secondary search stage comprises: 1) a correlation block for i) correlating the S-SCH signal with a 256-bit sequence z to produce a first correlated output sequence and ii) correlating the first correlated output sequence with sixteen Hadamard sequences to produce a vector output sequence, each vector comprising sixteen Hadamard-correlated values, one for each of the sixteen Hadamard sequences; 2) a maximum detection block for detecting a maximum Hadamard-correlated value in the each vector and generating an index sequence, each index identifying a vector position of the maximum Hadamard-correlated value; 3) a Reed-Solomon (R-S) decoding correction block for decoding and correcting 15 consecutive indexes in the index sequence and determining therefrom a codeword of length 3; and 4) a frame-time detector for determining from the codeword of length 3 a frame boundary of the S-SCH signal based on syndrome properties of an R-S code associated with the S-SCH code.

23 Claims, 10 Drawing Sheets

APPARATUS AND METHOD FOR SECONDARY SYNCHRONIZATION CHANNEL DETECTION IN A 3GPP WCDMA RECEIVER

CROSS-REFERENCE TO RELATED APPLICATION

The present invention is related to that disclosed and claimed in U.S. patent application Ser. No. 10/232,775, filed concurrently herewith, entitled "3GPP WCDMA RECEIVER USING PIPELINED APPARATUS AND METHOD FOR PERFORMING CELL SEARCHES." The related application is commonly assigned to the assignee of the present invention. The disclosures of the related patent application is hereby incorporated by reference for all purposes as if fully set forth herein.

TECHNICAL FIELD OF THE INVENTION

The present invention relates generally to wireless receivers and, more particularly, to an apparatus and method using properties of Comma-Free Reed-Solomon (CFRS) codes for detecting the secondary synchronization channel (S-SCH) in a 3GPP WCDMA wireless network.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication devices has created a corresponding demand for technical improvements to such devices. Generally speaking, wireless system designers attempt to minimize the cost of conventional radio receivers while improving the performance of such devices. Performance improvements include, among other things, lower power consumption, greater range, increased receiver sensitivity, lower bit error rates (BER), higher transmission rates, and the like.

A mobile station (or wireless device) routinely performs a cell search (or synchronization) function to detect and acquire the base stations of a wireless network in the vicinity of the wireless device. Fast detection of the base stations is critical to the performance of both the mobile station and the wireless network, particularly in the new 3GPP wideband code division multiple access (WCDMA) wireless systems currently under development. Fast detection of base stations allows a mobile station to access a wireless network more rapidly (i.e., reduces acquisition delay). Fast detection of base stations also enables the mobile station and the wireless network to perform faster handoffs between base station cell sites or between sectors of the same base transceiver subsystem (BTS) of a base station. Additionally, fast detection reduces the number of calls that are dropped during the handoff process.

However, the speed with which conventional mobile stations perform cell searches in $3^{rd}$ Generation Partnership Project (3GPP) WCDMA networks is relatively limited due to the complexity of the signal processing involved. A conventional mobile station typically performs three search stages in sequence. First, a primary search stage detects slot boundaries in the pilot channel signals of the wireless network. Next, a secondary search stage detects frame boundaries of the pilot channel signals. Finally, a tertiary (third) search stage detects the Gold codes for the base station. When all three stages are complete, a reset signal resets the three search stages and the process repeats. If noise or multipath fading causes the signal to be received improperly, the cell search process cannot resume until all three stages are complete and the next reset signal occurs. This reduces the speed and efficiency of the cell search process.

The speed of acquisition is also reduced by false lock conditions. One of the main goals in designing the cell-search module is to reduce the false lock probability at the final stage. False lock of the searcher, namely the condition in which the third stage of the process locks to an incorrect base station and/or frame timing, results in further delays during post-processing of the erroneous acquired timing/code. This delay, apart from being intolerable for the user, reduces the battery life of the mobile terminal.

Therefore, there is a need in the art for improved wireless mobile station receivers. In particular, there is a need for improved apparatuses and methods for performing synchronization functions (or cell searches). More particularly, there is a need for wireless receivers that can more rapidly search for and acquire the base stations of a wireless network cell site, with a reduced number of false lock conditions.

SUMMARY OF THE INVENTION

The present invention performs the cell search for the common pilot channel (CPICH) signal of a wireless network, such as a 3GPP WCDMA wireless network, using a three stage pipelined processing technique. In the first cell search stage, the received signal is correlated with the primary synchronization (Primary Sync) pattern (in a coherent/non-coherent fashion) and correlation peaks are detected. This part is implemented mostly in hardware and runs continuously, unless the receiver front-end circuitry is turned off. Next, appropriate peaks (if any) are selected by firmware (i.e., processor and memory executing code) and the slot-boundary corresponding to these peaks is determined. In the case of an initial acquisition, only one peak is selected and the frequency offset (FO) corresponding to that peak is coarsely estimated and corrected.

In the second cell search stage, for each Primary Sync correlation peak selected by the firmware in the first cell search stage, the received signal is correlated with a Secondary Sync pattern based on the corresponding slot-boundary. Based on correlation results, the frame boundary and code-group index are detected if a certain threshold is passed. This process is repeated as long as there are Primary Sync peaks selected by the firmware in the first cell search stage.

In the third cell search stage, for each frame boundary and code group index detected in the second search stage, the received signal is correlated with related P-CPCH sequences and the correct Gold code is detected if a certain threshold is passed. The first, second and third cell search stages are implemented in hardware and firmware. The third cell search stage processing is shorter than the second stage, so the three stages may be pipelined.

It is an object of the present invention to reduce the computational complexity of the firmware processing of the acquisition apparatus by reducing the number of operations required to detect the secondary synchronization channel, while retaining the false lock probability at a certain acceptable level. This is accomplished by invoking properties of Reed-Solomon codes, namely synchronization-detectable CFRS codes, and two-stage threshold testing.

To address the above-discussed deficiencies of the prior art, it is a primary object of the present invention to provide a pipelined apparatus for performing cell searches in a receiver. According to an advantageous embodiment of the present invention, the pipelined apparatus comprises a secondary search stage capable of receiving a secondary synchronization channel (S-SCH) signal comprising one of sixty-four codewords, wherein each of the codewords comprises a sequence of fifteen slots and each slot comprises a 256-bit secondary synchronization code (SSC). The secondary search stage comprises: 1) a correlation block for i) correlating the S-SCH signal with a 256-bit sequence z associated with the S-SCH signal to produce a first correlated output sequence and ii) correlating the first correlated output sequence with each one of sixteen Hadamard sequences associated with the S-SCH signal to produce a vector output sequence, where each vector comprises sixteen Hadamard-correlated values, one for the each of the sixteen Hadamard sequences associated with the S-SCH signal; 2) a maximum detection block capable of detecting a maximum Hadamard-correlated value in the each vector and generating an index sequence, wherein each index identifies a position of the maximum Hadamard-correlated value in the each vector; 3) a Reed-Solomon (R-S) decoding correction block capable of decoding and correcting 15 consecutive indexes in the index sequence and determining a codeword of length 3 associated with the 15 consecutive corrected indexes; and 4) a frame-time detector capable of receiving the codeword of length 3 from the R-S decoding correction block and determining therefrom a frame boundary of the S-SCH signal based on syndrome properties of an R-S code associated with the S-SCH code.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged mobile station receiver.

Figure 1:
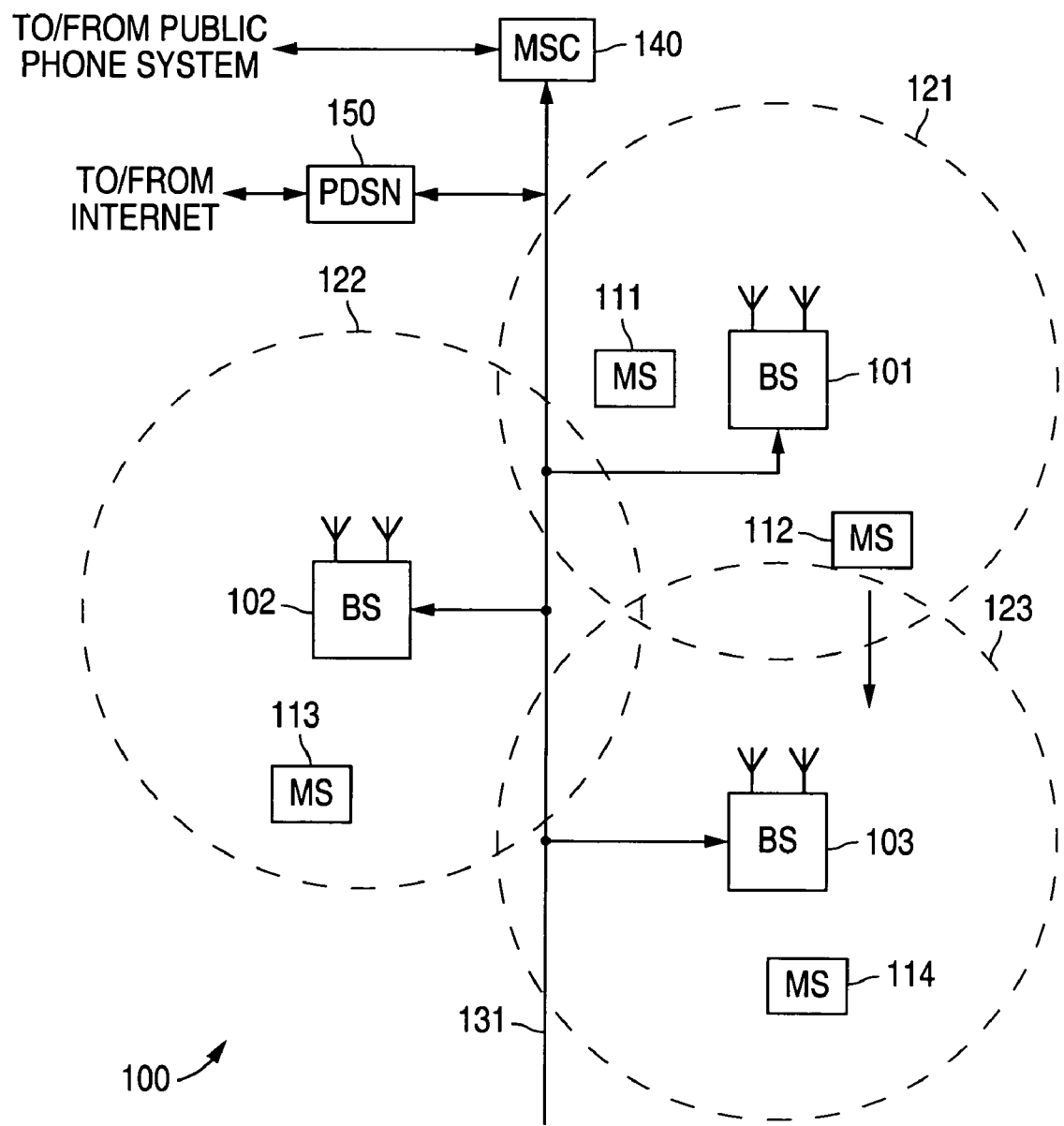
FIG. 1 illustrates an exemplary wireless network according to one embodiment of the present invention.

FIG. 1 illustrates exemplary wireless network 100 in which code division multiple access (CDMA) mobile station receivers according to the principles of the present invention may be used. Wireless network 100 comprises a plurality of cell sites 121–123, each containing a base station (BS), such as BS 101, BS 102, or BS 103. Base stations 101–103 communicate with a plurality of mobile stations (MS) 111–114 over wideband code division multiple access (WCDMA) channels according to the $3^{rd}$ Generation Partnership Project (3GPP) specification. Mobile stations 111–114 may be any suitable wireless devices, including conventional cellular radiotelephones, PCS handset devices, personal digital assistants, portable computers, or metering devices. The present invention is not limited to mobile devices. Other types of access terminals, including fixed wireless terminals, may be used. However, for the sake of simplicity, only mobile stations are shown and discussed hereafter.

Dotted lines show the approximate boundaries of the cell sites 121–123 in which base stations 101–103 are located. The cell sites are shown approximately circular for the purposes of illustration and explanation only. It should be clearly understood that the cell sites often have other irregular shapes, depending on the cell configuration selected and natural and man-made obstructions.

As is well known in the art, cell sites 121–123 are comprised of a plurality of sectors (not shown), each sector being illuminated by a directional antenna coupled to the base station. The embodiment of FIG. 1 illustrates the base station in the center of the cell. Alternate embodiments position the directional antennas in corners of the sectors. The system of the present invention is not limited to any particular cell site configuration.

In one embodiment of the present invention, BS 101, BS 102, and BS 103 comprise a base station controller (BSC) and one or more base transceiver subsystem(s) (BTS). Base station controllers and base transceiver subsystems are well known to those skilled in the art. A base station controller is a device that manages wireless communications resources, including the base transceiver stations, for specified cells within a wireless communications network. A base transceiver subsystem comprises the RF transceivers, antennas, and other electrical equipment located in each cell site.

BS 101, BS 102 and BS 103 transfer voice and data signals between each other and the public switched telephone network (PSTN) (not shown) and the Internet via communication line 131, mobile switching center (MSC) 140, and packet data serving node (PDSN) 150. MSC 140 is a switching device that provides services and coordination between the subscribers in a wireless network and external networks, such as the PSTN or Internet.

In the exemplary wireless network 100, MS 111 is located in cell site 121 and is in communication with BS 101. MS 113 is located in cell site 122 and is in communication with BS 102. MS 114 is located in cell site 123 and is in communication with BS 103. MS 112 is also located close to the edge of cell site 123 and is moving in the direction of cell site 123, as indicated by the direction arrow proximate MS 112. At some point, as MS 112 moves into cell site 123 and out of cell site 121, a hand-off will occur.

Each one of MS 111–114 routinely performs cell searches to detect the base stations of a wireless network in the vicinity of the mobile stations. Whenever one of MS 111–114 is turned on, an initial cell search is performed in order to search for and acquire at least one of base stations 101–103 of wireless network 100. Thereafter, each mobile station continues to perform cell searches in order to determine the strongest base station(s) in the vicinity and to identify available base stations to which the mobile station may be transferred in case it is necessary to perform a handoff. To improve the efficiency of these cell searches, the present invention provides a unique and novel apparatus and related method that perform cell searches using a three stage pipelined processing technique.

Figure 2:
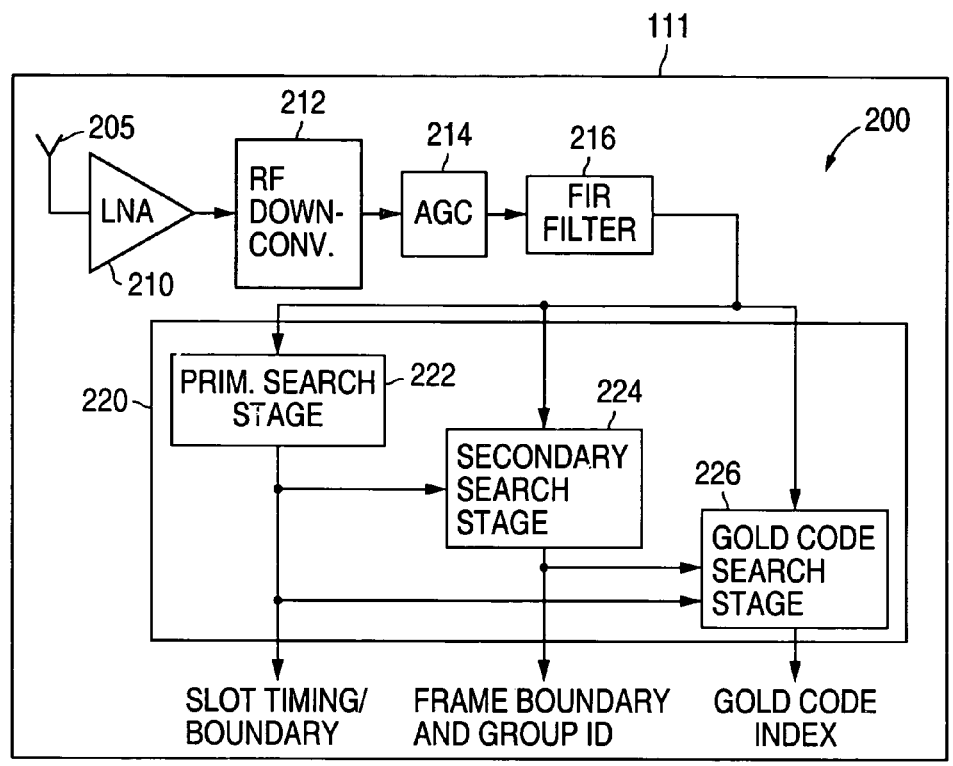
FIG. 2 is a high-level block diagram of an exemplary mobile station receiver containing a pipelined cell search block according to one embodiment of the present invention.

FIG. 2 is a high-level block diagram of exemplary mobile station 111, which implements code division multiple access (CMDA) receiver 200 containing pipelined cell search block 220 according to one embodiment of the present invention. CDMA receiver 200 comprises antenna 205, low-noise amplifier (LNA) 210, radio frequency (RF) down-converter 212, automatic gain control (AGC) 214, finite impulse response (FIR) filter 216, and pipelined cell search block 220. Pipelined cell search block 220 comprises primary search stage 222, secondary search stage 224, and Gold code search stage 226.

Antenna 205 receives the incoming common control pilot channel (CPICH) signal, primary synchronization channel (PSCH) signal, secondary synchronization channel (SSCH) signal, broadcast channel (BCH) signal, and other forward channel signals transmitted by one or more of BS 101–103 according to the 3GPP WCDMA specification. LNA 210 amplifies the received CDMA signals to an appropriate level for RF down-converter 212. RF down-converter 212 down-converts the amplified RF signal to a baseband or an intermediate frequency (IF) output signal. According to an exemplary embodiment of the present invention, the output of RF down-converter 212 also comprises an analog-to-digital converter (ADC) stage that digitizes the baseband or IF output signal into a stream of digital samples.

Depending on the type of modulation used, the baseband or IF output signal may be, for example, a binary phase-shift keying (BPSK) signal, a quadrature phase-shift keying (QPSK) signal, a 16 quadrature amplitude modulated (QAM) signal, or the like. According to an advantageous embodiment of the present invention, RF down-converter 212 down-converts a QPSK signal and outputs a stream of in-phase (I) signal samples and a stream of quadrature phase (Q) samples to AGC 214. AGC 214 adjusts the gain of the I and Q samples for subsequent filtering by FIR filter 216.

The filtered I and Q samples are then input to primary search stage 222, secondary search stage 224, and Gold code search stage 226. As will be explained below in greater detail, primary search stage 222 detects the slot boundary and timing information using the primary synchronization channel (PSCH) signal. The slot timing information is used to enable second search stage 224, which then detects the frame boundary and the group ID for the local base stations using the secondary synchronization channel (SSCH) signal.

Finally, Gold code search stage 226 uses the frame boundary, slot boundary and group ID information to determine the Gold code index in the common control pilot channel (CPICH) signals transmitted by the local base stations. Unlike conventional CDMA cell search algorithms, after an initial acquisition phase by primary search stage 222, secondary search stage 224 and Gold code search stage 226 operate in parallel with each other and with primary search stage 222.

In an advantageous embodiment, the present invention operates in accordance with the 3GPP WCDMA standard, so that forward channel data are transmitted to mobile stations 111–114 in frames. The frame rate is 100 frames/second (i.e., frame rate=100 Hz). Each frame contains fifteen (15) slots, giving a 1500 Hz slot rate. Each slot comprises ten (10) data symbols, giving a 15 KHz symbol rate. Each data symbol is spread using a 256 chip spreading code, giving a 3.84 MHz chip rate. Additionally, the ADC stage in the output of RF down-converter 212 samples the in-phase (I) and quadrature (Q) signals at twice the chip rate (i.e., 2 samples per chip), giving a 7.68 MHz sampling rate. Thus, there are a total of 512 samples for each symbol and 5120 samples for each slot.

Also, in accordance with the 3GPP WCDMA standard, the primary synchronization channel (PSCH) signal contains a 256-chip codeword that repeats with a period equal to one slot duration. The same complex-valued, unmodulated codeword is used in every cell. Thus, the first timing information, namely the beginning of each slot, is obtained from the primary synchronization channel in primary search stage 222.

Figure 3:
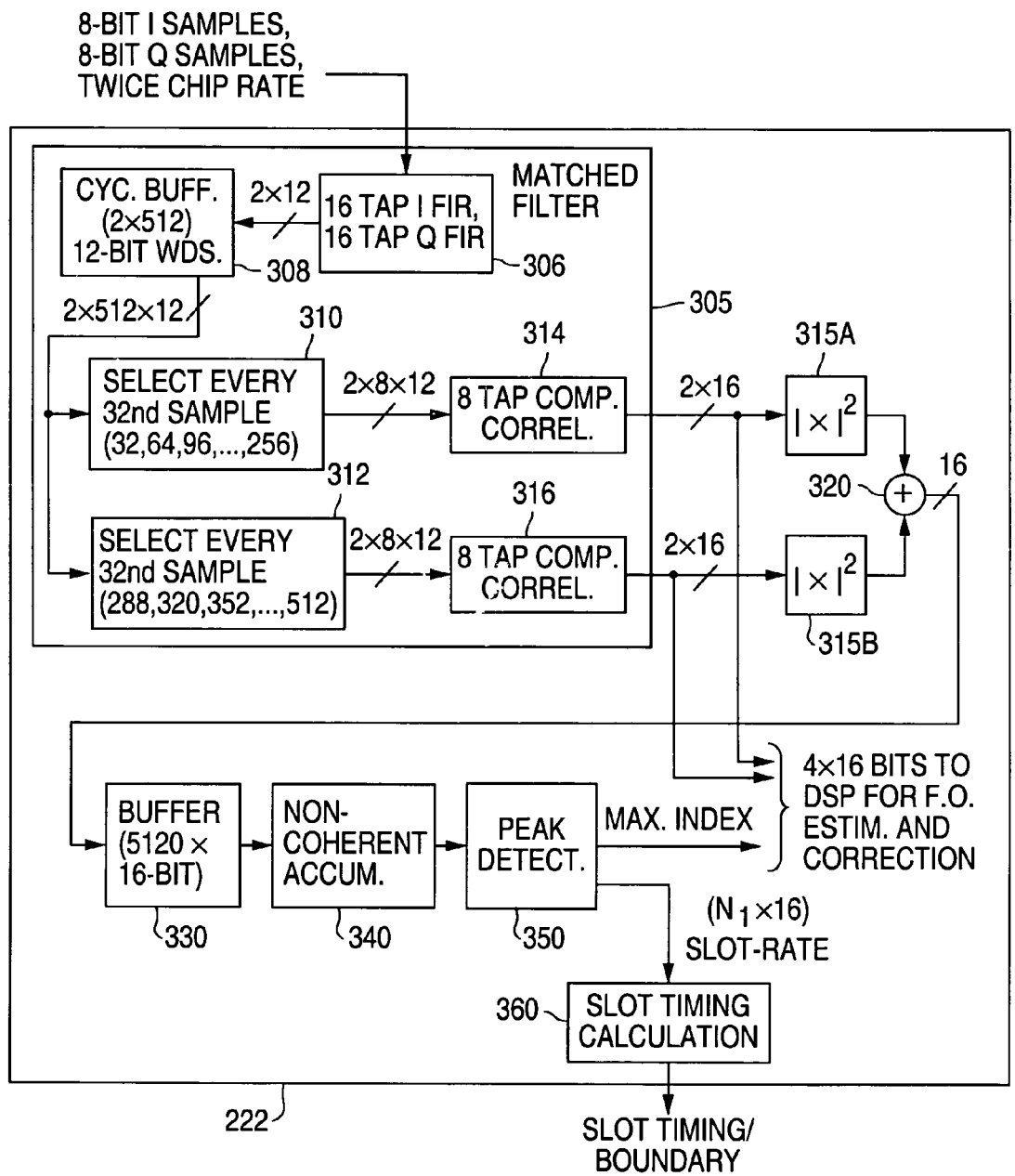
FIG. 3 is a detailed block diagram of the primary search stage of the exemplary mobile station receiver according to an exemplary embodiment of the present invention.

FIG. 3 is a detailed block diagram of primary search stage 222 of exemplary mobile station 111 according to an exemplary embodiment of the present invention. Primary search stage 222 comprises matched filter 305, squaring units 315A and 315B, adder 320, buffer 330, non-coherent accumulator 340, peak detector 350, and slot timing calculation block 360. Most of the circuit blocks in primary search stage 222 are implemented in hardware, slot timing calculation block 360 may be implemented in firmware. Primary search stage 222 runs continuously as long as the front end of receiver 200 operates.

Matched filter 305 receives the output of FIR filter 216 as a stream of 8-bit in-phase (I) samples at twice the chip rate and a stream of 8-bit quadrature (Q) samples at twice the chip rate. Matched filter 305 detects the unmodulated, complex-valued 256-chip codeword in the primary synchronization channel (PSCH) signal. Matched filter 305 comprises finite impulse response (FIR) filter 312, cyclic buffer 308, select every $32^{nd}$ sample block 310, select every $32^{nd}$ sample block 312, 8-tap complex correlator 314, and 8-tap complex correlator 316. FIR filter 306 comprises a 16-tap in-phase is (I) FIR filter that filters I samples and a 16-tap Q FIR filter that filters quadrature (Q) samples. FIR filter 306 operates at the chip rate. The outputs of FIR filter 306 are filtered 12-bit I and Q samples at twice the chip rate.

The outputs of FIR filter 306 are stored in cyclic buffer 308. Cyclic buffer 308 stores 512 entries, each entry containing a 12-bit I sample (i.e., 12-bit word) and a 12-bit Q sample (i.e., 12 bit word). All 512 I and Q entries in cyclic buffer 308 are available to select every $32^{nd}$ sample block 310 and select every $32^{nd}$ sample block 312. Select every $32^{nd}$ sample block 310 reads out every $32^{nd}$ entry (for a total of 8 entries) from cyclic buffer 308 and passes the eight 12-bit I samples and eight 12-bit Q samples (i.e., 2×8×12) to 8-tap complex correlator 314 for processing. Select every $32^{nd}$ sample block 310 then decrements and grabs another group of 8 entries that are spaced 32 entries apart. For example, during a first cycle, select every $32^{nd}$ sample block 310 reads entries [32, 64, 96, . . . , 256] from cyclic buffer 308. During the next cycle, select every $32^{nd}$ sample block 310 reads entries [31, 63, 95, . . . , 255] from cyclic buffer 308.

Select every $32^{nd}$ sample block 312 operates in a similar manner. Select every $32^{nd}$ sample block 312 reads out every $32^{nd}$ entry (for a total of 8 entries) from cyclic buffer 308 and passes the eight 12-bit I samples and eight 12-bit Q samples (i.e., 2×8×12) to 8-tap complex correlator 316 for processing. However, select every $32^{nd}$ sample block 312 is shifted 256 entries with respect to select every $32^{nd}$ sample block 310 and begins at entry 288. Select every $32^{nd}$ sample block 312 then decrements and grabs another group of 8 entries that are spaced 32 entries apart. For example, during a first cycle, select every $32^{nd}$ sample block 312 reads entries [288, 320, 352, . . . , 512] from cyclic buffer 308. During the next cycle, select every $32^{nd}$ sample block 312 reads entries [287, 319, 351, . . . , 511] from cyclic buffer 308.

The outputs of complex correlator 314 are filtered 16-bit I samples and filtered 16-bit Q samples. The outputs of complex correlator 316 also are filtered 16-bit I samples and filtered 16-bit Q samples. The four sets of I and Q samples are used for frequency offset (FO) estimation and correction.

The 16-bit I samples and 16-bit Q samples from complex correlator 314 are squared by squaring unit 315A to produce the magnitude ($I^2+Q^2$) for non-coherent detection. The 16-bit I samples and 16-bit Q samples from complex correlator 316 are squared by squaring unit 315B to produce the magnitude ($I^2+Q^2$) for non-coherent detection. The magnitude outputs from squaring units 315A and 315B are non-coherently added by adder 320 to produce a 16-bit result and the results are stored in buffer 330. Buffer 330 stores 5120 entries, wherein each entry is a 16-bit value. The 5120 entries are equivalent to all of the samples from an entire slot (i.e., 10 symbols).

The buffered entries in buffer 330 are sent to non-coherent accumulator 340 for summing. Non-coherent accumulator 5120 outputs accumulated values once every 5120 samples. Over the course of several slots, peaks are formed in the data output of non-coherent accumulator at each slot boundary. Peak detector 350 detects the peaks in the output of accumulator 340. Optionally, peak detector 350 may compare all peaks to a predetermined peak threshold value, referred to simply as Threshold 1. Threshold 1 may be fixed or may be varied according to the average power measured at the input to primary search stage 222. The circuit blocks that estimate the power and modify Threshold 1 are not shown in FIG. 3.

Peak detector 350 may disregard peaks that are not greater than Threshold 1. Of the remaining peaks, peak detector 350 identifies the highest peak (i.e., slot boundary) and its sample position in cyclic buffer becomes the Maximum Index value. The is peak value outputs of peak detector 350 and the corresponding index values (or peak indices) are used by slot timing calculation block 360 to generate the slot timing/boundary information that is used by secondary search stage 224 and Gold code search stage 226.

Matched filter 305 is used instead of a single 256-tap FIR filter in order to reduce the effect of frequency offset. The outputs of 315A and 315B are non-coherently added. The superior performance of this approach is most evident in the presence of frequency offset. The vectors at the output of buffer 330 are accumulated over several slots in order to come up with more accurate results when detecting peaks and reducing the effect of noise.

Before data can be retrieved from the combined received signal, receiver 200 must recover the start of each frame as well. Further, receiver 200 must identify the set (i.e. Group ID) or base station to which the base station from which data is received belongs. For this purpose, the received signal from FIR filter 216 is input to the secondary synchronization channel (S-SCH) signal detector (i.e., secondary search stage 224), along with the output of the primary synchronization channel (P-SCH) signal detector (i.e., primary search stage 222) which indicates the slot time.

In contrast to the primary synchronization channel (P-SCH) signal, the secondary synchronization channel (S-SCH) signal varies from one base station to another. There are a total of sixteen (16) different sequences, each containing 256 chips, that may be used in the S-SCH signal by all base stations to generate 64 sequences of length fifteen (i.e., the number of slots per frame). The 256-chip S-SCH signal sequences are sent at the beginning of each slot in parallel with the primary S-SCH signal. By detecting the S-SCH signal, receiver 200 obtains the frame synchronization. This is because the 64 different code sequences are chosen such that their cyclic shifts are unique. That is, the cyclic shift of a first sequence by L (for 0<L<16) is not equivalent to a cyclic shift of a second sequence or to another cyclic shift of the first sequence itself.

Furthermore, the 64 codewords in the secondary synchronization channel (S-SCH) signal will match only one of the 64 different code groups of 8 scrambling codes each that are used by wireless network 100. Therefore, detection of the secondary synchronization channel (S-SCH) signal obtains the scrambling code group ID to which the base station belongs.

The 16 S-SCH signal codes are, as their primary counterparts, complex valued with identical real and imaginary components. Each code is constructed from element-wise multiplication of two 256-bit vectors. The first one of these two 256-bit vectors is the same for all 16 S-SCH signal codes, and is defined as:

$$z=[b,b,b,-b,b,b,-b,-b,b,-b,b,-b,-b,-b,-b,-b], \quad \text{[Eqn. 1]}$$

where $b=[a_1, -a_2]$, such that $a_1$ and $a_2$ denote the first and second 8-bit vectors resulting from partitioning vector "a" (defined in primary SCH definition) into two halves, respectively.

The second one of these two vectors is a Hadamard sequence of length 256, which is selected from the rows of Hadamard matrix $H_8$. Actually, the 16 S-SCH signal codes are differentiated by assigning different rows of matrix $H_8$ to them. Numbering the 256 rows of $H_8$ from the top, starting by row n=0, the $k^{th}$ S-SCH signal code (for k=1, 2, . . . , 16), can be written as $$SSC_k=(1+j)h_p^{**}z, \quad \text{[Eqn. 2]}$$

where $h_p$, p=16*(k−1), denotes the $p^{th}$ row of matrix $H_8$, and ** is an operator indicating the element-wise multiplication of two codewords.

Passing the signals through a filter matched to the complex-valued $SSC_k$ code forms peaks corresponding to the starts of frames. The next step in S-SCH detection is to detect these peaks and obtain the time at which every peak occurs.

This matched filtering can be implemented in two main steps. First, the signal is correlated with the sequence, z (in Equation 1 above), and then is passed through Hadamard matched filters to search for the slot whose beginning is aligned with the start of a frame. Since there are sixteen (16) Hadamard codes used in the S-SCH signals, sixteen (16) correlators are employed for the second step.

Figure 4:
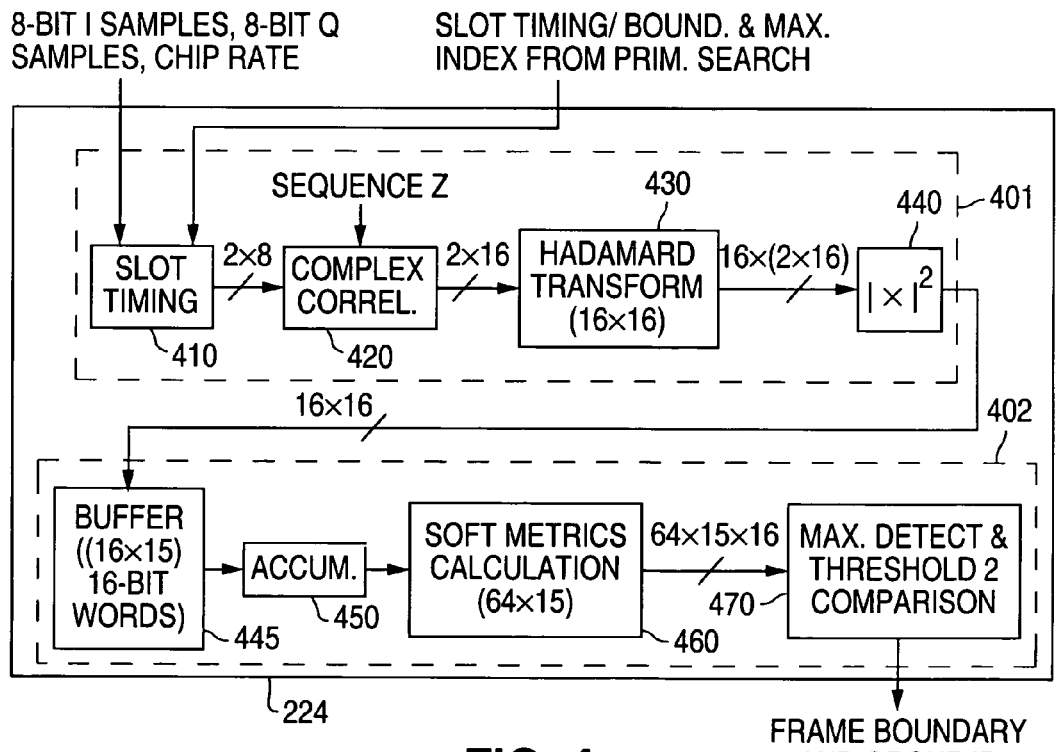
FIG. 4 is a detailed block diagram of the secondary search stage of the exemplary mobile station receiver according to a first exemplary embodiment of the present invention.

FIG. 4 is a detailed block diagram of secondary search stage 224 of exemplary mobile station 111 according to an exemplary embodiment of the present invention. Secondary search stage 224 comprises slot timing block 410, complex correlator 420, Hadamard transform block 430, squaring unit 440, buffer 445, accumulator 450, soft metrics calculation block 460, and maximum detection and Threshold 2 comparison block 470. Dotted line boundary 401 indicates circuit blocks that may be implemented in hardware. Dotted line boundary 402 indicates circuit blocks that may be implemented in firmware.

Slot timing block 410 receives the 8-bit in-phase (I) samples and 8-bit quadrature (Q) samples from FIR filter 216 at the chip rate. Double sampling is not required since slot timing block 410 uses the slot timing and Maximum Index information from primary search stage 222 to properly align the received I and Q samples. Next, the I samples and Q samples are correlated by complex correlator 420 using the 256-bit sequence Z from above. The correlated output comprises 16-bit I signal values and a 16-bit Q signal values.

Next, the 16-bit I and Q signals are processed in Hadamard transform block 430. Hadamard transform block 430 comprises sixteen separate matched filters for performing the Hadamard transform. As noted above, each of the sixteen Hadamard matched filters search for the slot whose beginning is aligned with the start of a frame. Since there are sixteen (16) Hadamard codes used in the S-SCH signals, sixteen (16) Hadamard matched filters (i.e., correlators) are employed by Hadamard transform block 430. This produces 16 separate 16-bit I signal outputs and 16 separate 16-bit Q signal outputs.

For each of the 16 pairs of 16-bit I and Q signal value from Hadamard transform block 430, squaring unit 440 produces the magnitude ($I^2+Q^2$). The outputs of squaring block 440 are sixteen separate 16-bit values that are stored in buffer 445. Correlation with 16 Hadamard codes is repeated for the next 14 slots and the results for all 15 slots are stored in buffer 445. Thus, buffer 445 stores the outputs of squaring block 440 for an entire frame of 15 slots. The entries from all 15 slots stored in buffer 445 are sent to accumulator 450 for summing, thereby forming peaks in the data.

For each of the 64 codewords (which are associated to various code groups) and for their 15 shifted versions, soft metric calculation block 460 calculates a soft metric (parameter) by invoking respective correlation values over each slot and summing up the soft values over 15 slots. Maximum detection and threshold 2 comparison block 470 detects the maximum value of the metrics over 64×15 codewords. Next, maximum detection and Threshold 2 comparison block 470 compares the detected maximum value to Threshold 2. If it does not exceed Threshold 2, a "missing the synchronization" condition is reported. The outputs of maximum detection and Threshold 2 comparison block 470 are the frame boundary and the Group ID of the base stations in the vicinity of mobile station 111. The codeword-associated group ID and frame timing are reported to Gold code search stage 226 for scrambling Gold code detection.

Threshold 2 is computed by scaling the estimated power of the received signal. The scaling factor is derived such that the false alarm rate is minimized while the missing probability is maintained at an acceptable low level for the overall acquisition time. Correlation of the received signal, which is already aligned to the start of a slot, with all possible 16 Hadamard codewords is obtained for 15 slots. The corresponding correlation values are accumulated over two (or generally $N_f$) frames to obtain fifteen 16-tuple correlation vectors.

Figure 5:
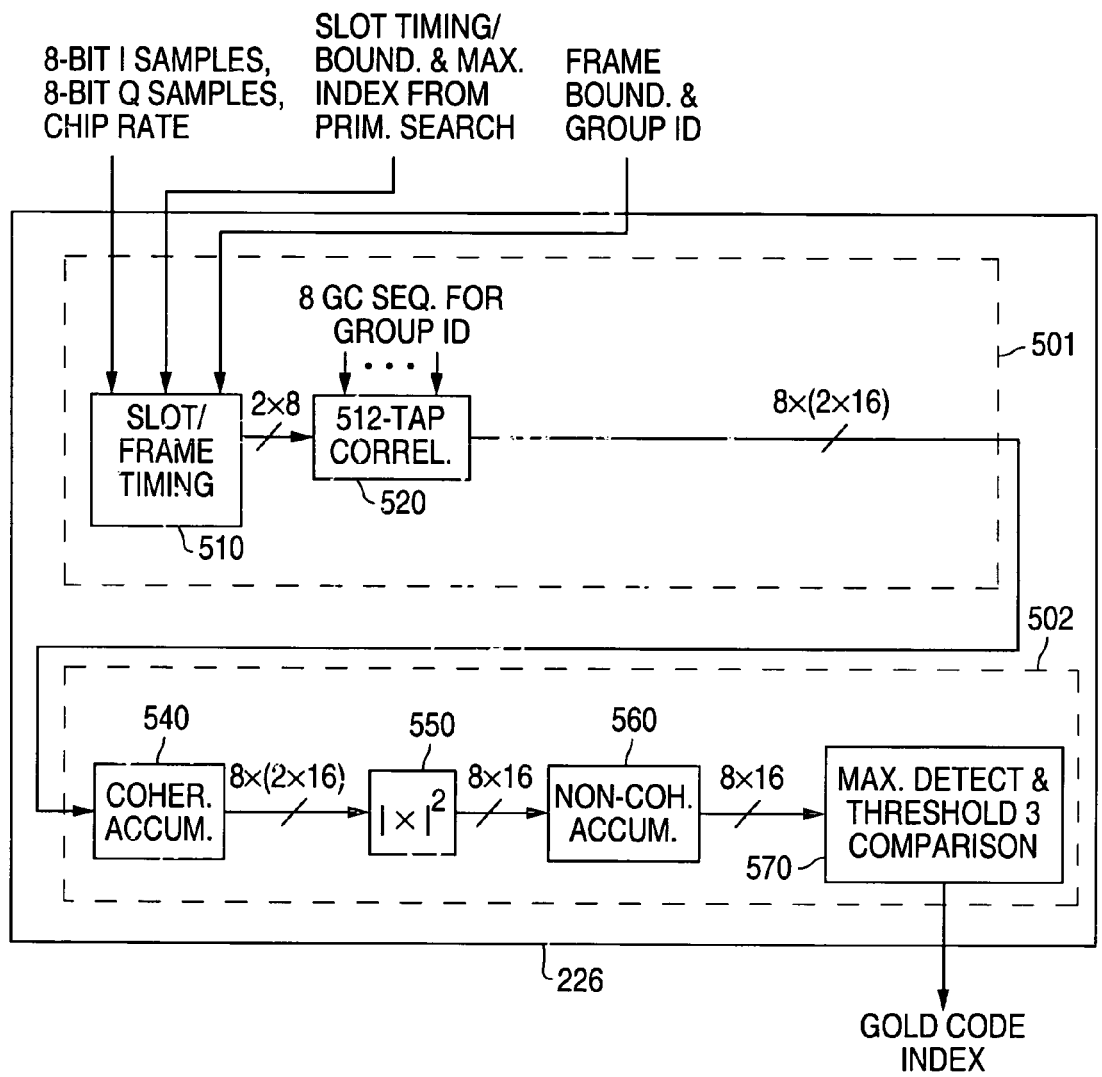
FIG. 5 is a detailed block diagram of the Gold code search stage of the exemplary mobile station receiver according to an exemplary embodiment of the present invention.

FIG. 5 is a detailed block diagram of Gold code search stage 226 of exemplary mobile station 111 according to an exemplary embodiment of the present invention. Gold code search stage 226 comprises frame timing block 510, correlator 520, coherent accumulator 540, squaring unit 550, non-coherent accumulator 560, and maximum detection and Threshold 3 comparison block 570. Dotted line boundary 501 indicates circuit blocks that may be implemented in hardware. Dotted line boundary 502 indicates circuit blocks that may be implemented in firmware.

Slot timing block 510 receives the 8-bit I samples and 8-bit Q samples from FIR filter 216 at the chip rate. Doubling sampling is not required since slot timing block 510 uses the frame and slot timing, Maximum Index information and Group ID from primary search stage 222 and secondary search stage 224 to properly align the received I and Q samples. In the initial search, there are $N_{SC}=8$ scrambling Gold codes for each group ID found by secondary search stage 224. The received common control pilot channel (CPICH) signal is correlated by 512-tap correlator 520 over $n_{co}$ symbols with all 8 scrambling codes for the detected code group ID from secondary search stage 224. The correlated output of correlator 520 comprises eight (8) separate 16-bit I signal values and eight (8) separate 16-bit Q signal values. The output of correlator 520 has a sample rate that is 1/512 of the I and Q sampling rate.

The eight pairs of 16-bit I and Q outputs of correlator 520 are summed by coherent accumulator 540. Squaring unit 550 squares the eight pairs of 16-bit outputs of coherent accumulator 540 to produce eight separate 16-bit quantities ($I^2+Q^2$). Then non-coherent accumulator 560 sums the eight outputs of squaring unit 550. Instead of using only coherent accumulation over a sequence of data, coherent accumulator 540 and non-coherent accumulator 560 are implemented in order to reduce the effect of frequency offset.

Maximum detection and Threshold 3 comparison block 570 finds the maximum value in each of the eight outputs of non-coherent accumulator 560 and compares the maximum values to Threshold 3. Only the highest maximum value at the output of non-coherent accumulator 560 that exceeds the Threshold 3 value is chosen. The Gold code that corresponds to the highest maximum value is the correct Gold code index. If the maximum value exceeds Threshold 3, the corresponding Gold code is reported to the finger management block as the cell-specific Gold code. Threshold 3 is computed by scaling the estimated received power with an amount that is obtained according to the length of coherent and non-coherent correlations in blocks 540 and 560.

Figure 6:
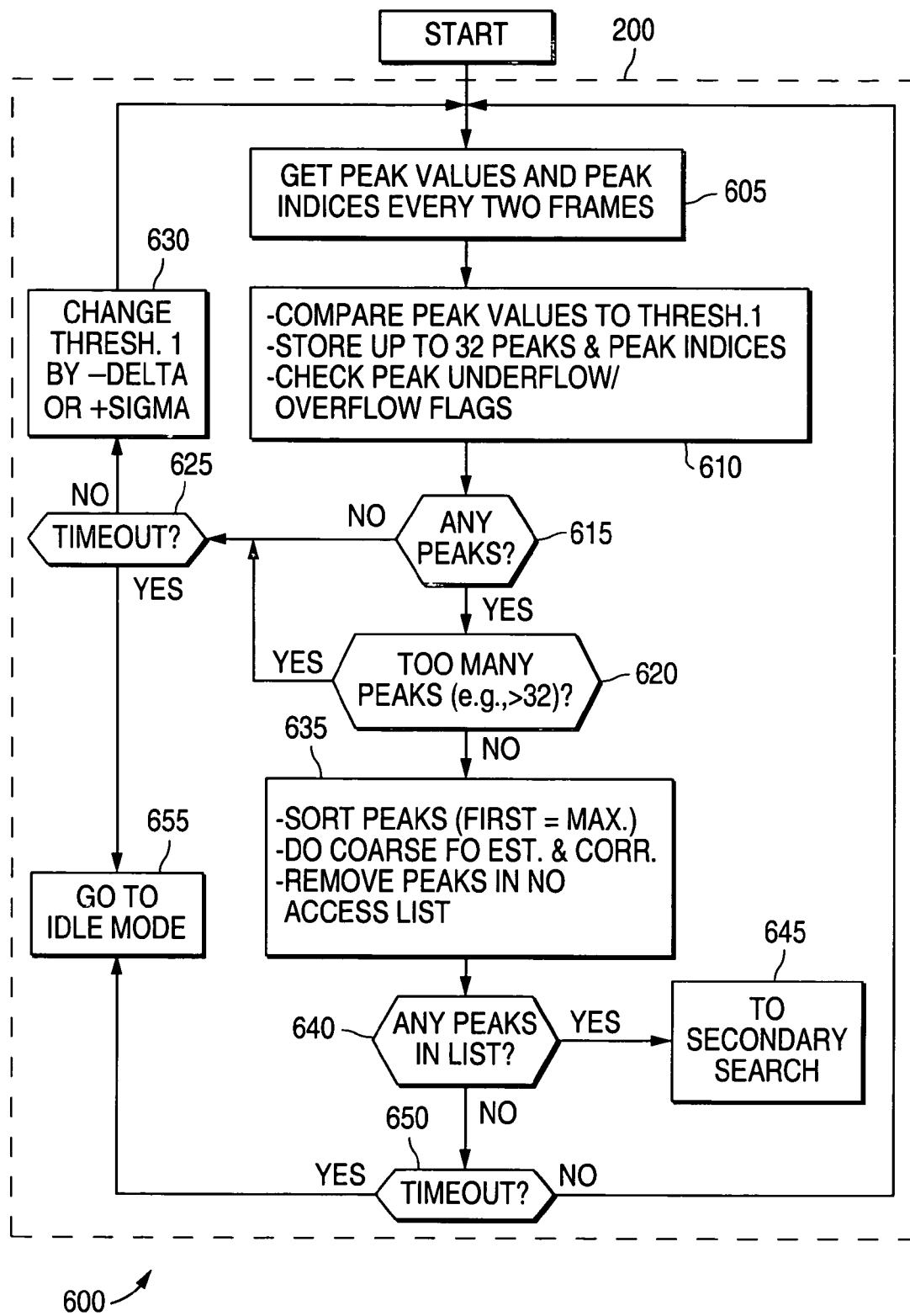
FIG. 6 is a flow diagram illustrating the operation of the primary search stage according to an exemplary embodiment of the present invention.

FIG. 6 illustrates flow diagram 600, which depicts the operation of primary search stage 222 of exemplary mobile station 111 according to an exemplary embodiment of the present invention. Primary search stage 222 gets peak values and indices every two frames (process step 605). The peaks are compared to Threshold 1 (process step 610). If no peaks are detected, the underflow flag is set. If more than 32 peaks are detected, the overflow flag is set. If the underflow flag (i.e., no peaks exceed Threshold 1) is set (process step 615) or if the overflow flag (i.e., too many peaks exceed Threshold 1) is set (process step 620), primary search stage 222 determines if a timeout has occurred (process step 625). If a timeout has occurred, cell search block 220 goes to idle mode (process step 655). If a timeout has not occurred, primary search stage 222 changes Threshold 1 by −Δ (if no peak exceeds Threshold 1) or by +δ (if too many peaks exceed Threshold 1) (process step 630) and resumes getting new peaks and their indices (process step 605).

If some peaks exceed Threshold 1 (process step 615), but not too many peaks (process step 620), peak detector 350 of primary search stage 222 sorts the peaks and identifies the highest peak as the Maximum Index value. Receiver 200 performs coarse frequency offset estimation and correction using the Maximum index value. If any of the peaks correspond to a base station that is in the No-Access list, peak detector 350 removes the No-Access list peaks.

If no peaks remain after the No-Access list peaks are removed (process step 640), primary search stage 222 determines if a timeout has occurred (process step 650). If a timeout has occurred, cell search block 220 goes to idle mode (process step 655). If a timeout has not occurred, primary search stage 222 resumes getting new peaks and their indices (process step 605). If some peaks still remain after the No-Access list peaks are removed (process step 640), secondary search stage 224 is enabled (process step 645).

Figure 7:
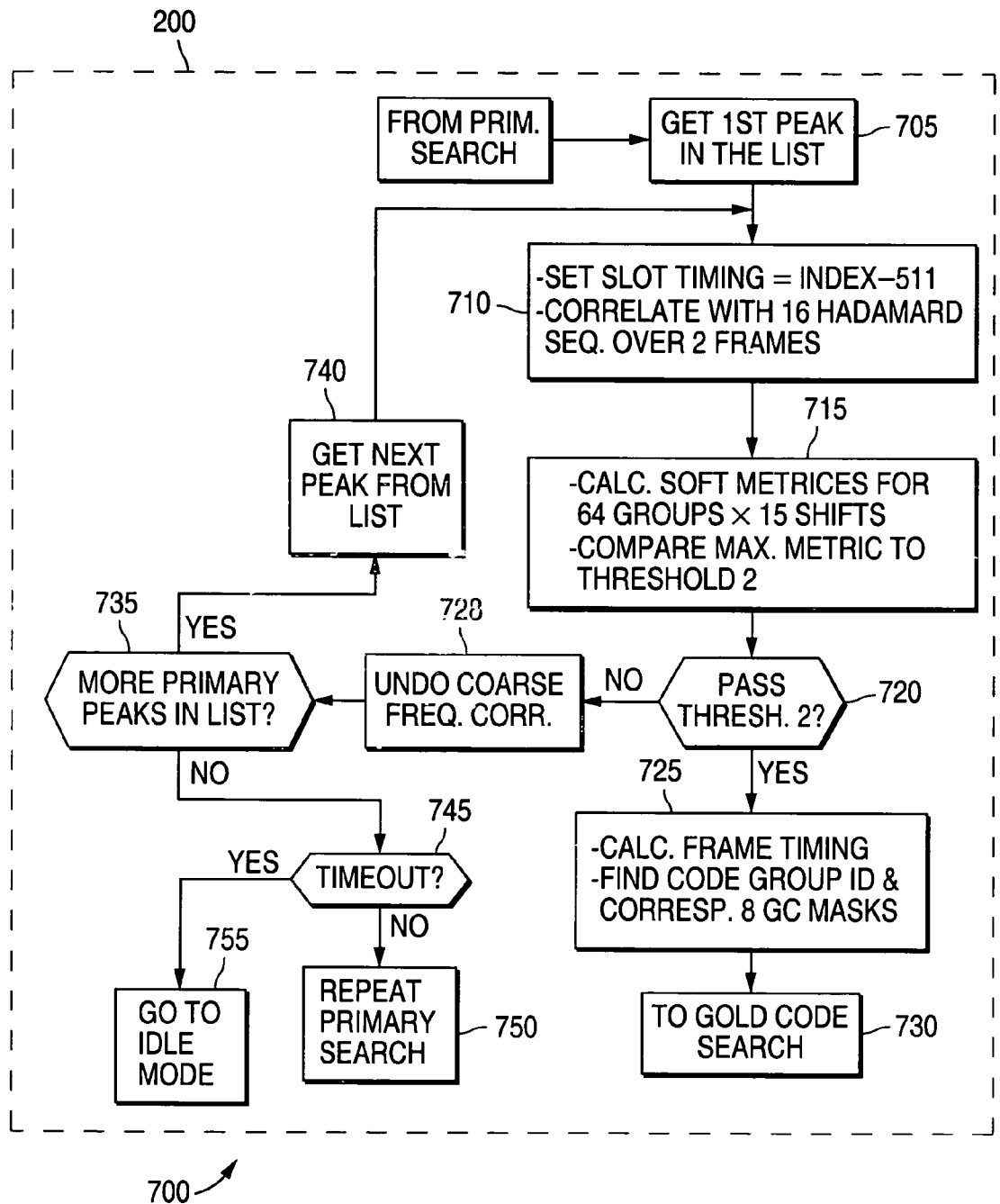
FIG. 7 is a flow diagram illustrating the operation of the secondary search stage according to the first exemplary embodiment of the secondary search stage illustrated in FIG. 4.

FIG. 7 illustrates flow diagram 700, which depicts the operation of secondary search stage 224 of exemplary mobile station 111 according to an exemplary embodiment of the present invention. Once enabled by primary search stage 222, secondary search stage 224 performs a correlation on the secondary synchronization channel (S-SCH) signal with the 256-bit sequence, z, in Equation 1 above. The correlated output is then correlated with 16 possible Hadamard sequences (process step 710). Soft metric values are calculated for all 16 Hadamard transform outputs. Then, the maximum metric is compared to Threshold 2 (process step 715).

If the maximum metric exceeds Threshold 2 (process step 720), secondary search stage 224 calculates the frame timing and determines from the corresponding Hadamard code the group ID of the maximum metric (process step 725). The frame timing and group ID are sent to Gold code search stage 226 (process step 730).

It is recalled that primary search stage 222 may identify more than one peak and that the peak values and indices for multiple peaks are transferred to secondary search stage 224. If the maximum metric does not exceed Threshold 2 (process step 720), secondary search stage 224 undoes the coarse frequency correction by changing the carrier frequency by the estimated frequency offset derived from the outputs of primary search stage 222, but in the opposite direction (process step 728). Secondary search stage 224 then determines if there are additional slot peaks from primary search stage 222 (process step 735). If there are more peaks, secondary search stage 224 gets the next peak from the list (process step 740) and re-performs correlation with the sequence, z, and the 16 possible Hadamard codes (process steps 710 and 715). If there are no more peaks in the list, secondary search stage 224 determines if a timeout has occurred (process step 745). If a time out has occurred, cell search block 220 goes to idle mode (process step 755). If a time out has not occurred, primary search stage 224 is repeated (process step 750).

Figure 8:
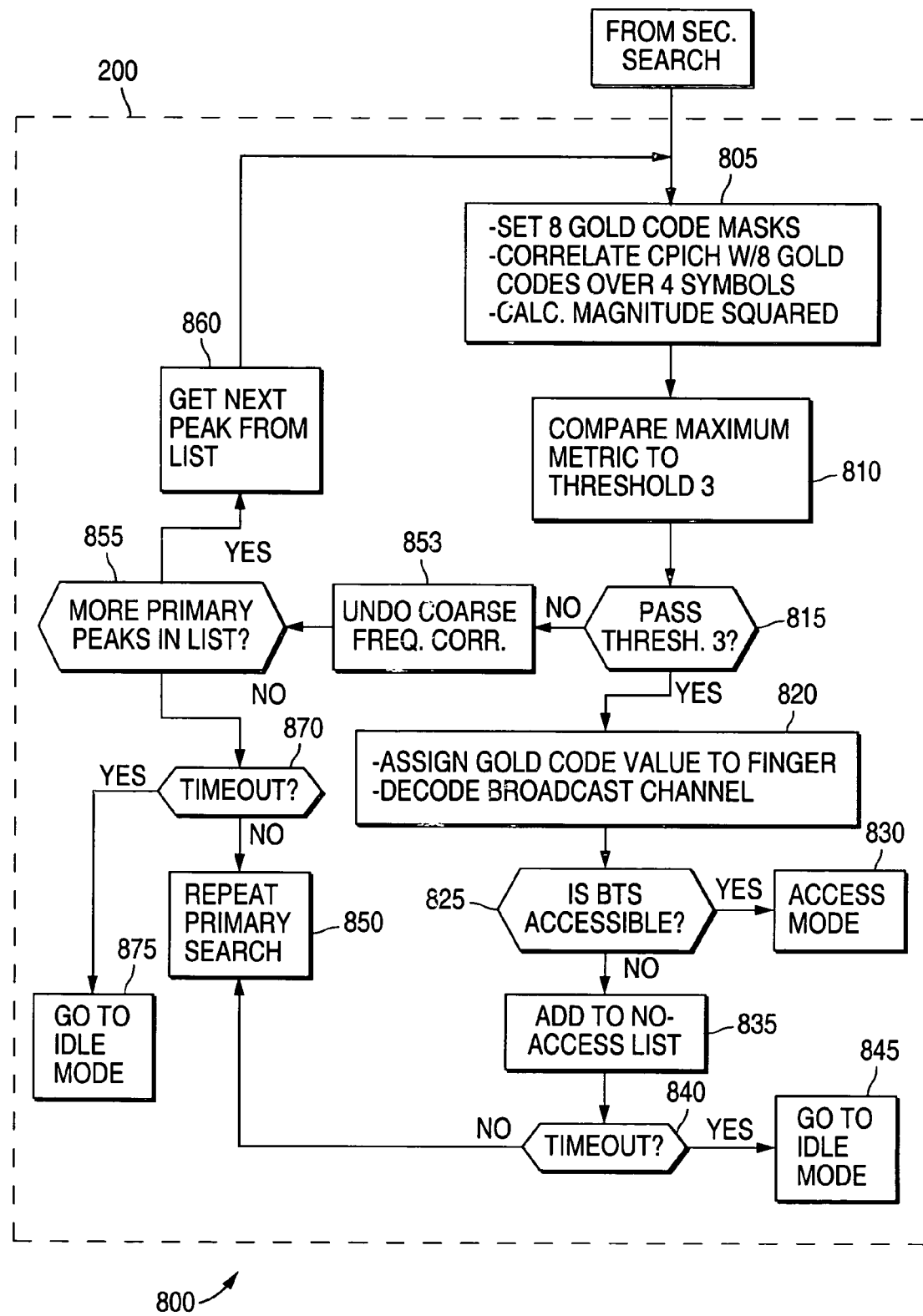
FIG. 8 is a flow diagram illustrating the operation of the Gold code search stage of the exemplary mobile station receiver according to an exemplary embodiment of the present invention.

FIG. 8 illustrates flow diagram 800, which depicts the operation of Gold code search stage 226 of exemplary mobile station 111 according to an exemplary embodiment of the present invention. Gold code search stage 226 performs multiple correlations on the common control pilot channel (CPICH) signal with the eight Gold codes identified by the Group ID data received from secondary search stage 224. The magnitudes of the correlator outputs are squared (process step 805). Soft metric values are calculated for all eight (8) Gold code sequence outputs. Then, the maximum metric is compared to Threshold 3 (process step 810).

If the maximum metric exceeds Threshold 3 (process step 815), Gold code search stage 226 assigns a Gold code to a Rake finger in receiver 200 to the detected BTS (process step 820) and decodes the broadcast channel. If the detected BTS is accessible, cell search block 220 goes into access mode (process step 830). If the detected BTS is not accessible, receiver 200 adds the detected BTS to the No-Access list (process step 835) and determines if a timeout has occurred (process step 840). If a time out has occurred, Gold code search stage 226 goes to idle mode (process step 845). If a time out has not occurred, primary search stage 224 is repeated (process step 850) until a timeout occurs (process step 870).

If the maximum metric does not exceed Threshold 3 (process step 815), Gold code search stage 226 undoes the coarse frequency correction by changing the carrier frequency by the estimated frequency offset derived from the outputs of primary search stage 222, but in the opposite direction (process step 853). Gold code search stage 226 then determines if there are additional slot peaks in the list from primary stage 222 (process step 855). If there are more peaks, the process gets the next peak (process step 860). If the last peak has been completed, Gold code search stage 226 determines if a timeout has occurred (process step 870). If a time out has occurred, Gold code search stage 226 goes to idle mode (process step 755). If a time out has not occurred, primary search stage 224 is repeated (process step 850).

Figure 9A:
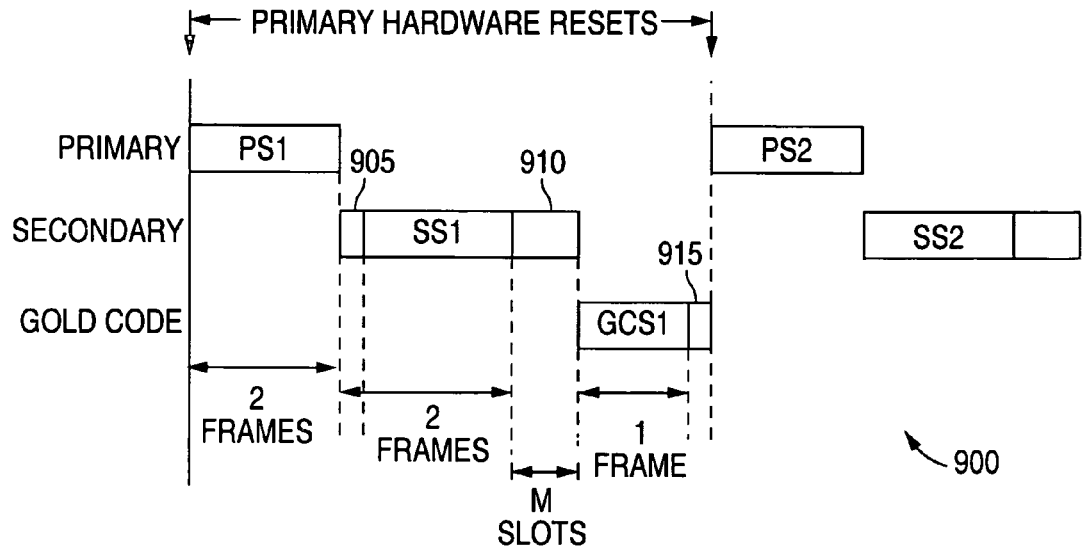
FIG. 9A is a timing diagram illustrating a cell search operation in a conventional mobile station receiver according to an exemplary embodiment of the prior art.

FIG. 9A depicts timing diagrams 900, which illustrates a cell search operation in a conventional mobile station receiver according to an exemplary embodiment of the prior art. As FIG. 9A illustrates, a first primary search phase (PS1), a first secondary search phase (SS1), and a first Gold code search phase (GCS1) execute serially before a second primary search phase (PS2) and a second secondary search phase (SS2) may occur. Block 905 indicates DSP processing time when the Maximum index value is being calculated. Block 910 indicates DSP processing time when the soft metrics in a prior art secondary search stage are being calculated. Block 915 indicates DSP processing time when the soft metrics in a prior art Gold code search stage are being calculated.

Figure 9B:
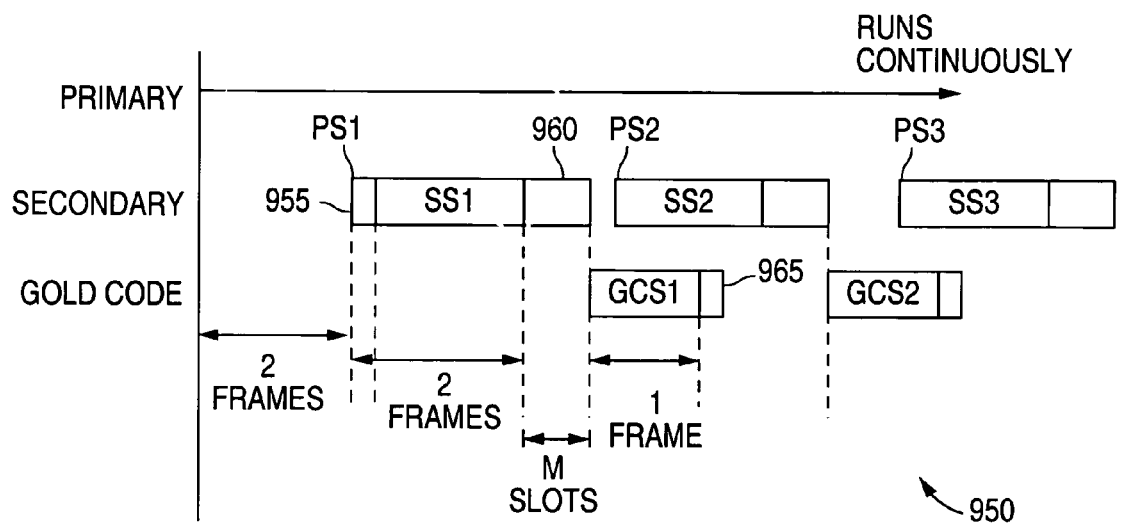
FIG. 9B is a timing diagram illustrating the operation of the pipelined cell search block of the exemplary mobile station receiver according to an exemplary embodiment of the present invention.

FIG. 9B depicts timing diagram 950, which illustrates the operation of pipelined cell search block 220 of exemplary mobile station 111 according to an exemplary embodiment of the present invention. As FIG. 9B illustrates, the primary search is continuously running. PS1, PS2, and PS3 represent instances when search results are available from primary search stage 222. Secondary search stage 224 starts when the peaks from primary search stage 222 are available. If the group ID and frame timing are successfully found in secondary search stage 224, Gold code search stage 226 then starts to find the suitable Gold code. While Gold code search stage 226 is running, secondary search stage 224 may produce a new group ID and frame timing for the next process in Gold code search stage 226. Block 955 indicates DSP processing time when the Maximum index value is being calculated. Block 960 indicates DSP processing time when the soft metrics in secondary search stage 224 are being calculated. Block 965 indicates DSP processing time when the soft metrics in Gold code search stage 226 are being calculated.

The first exemplary embodiment of secondary search stage 224 described above in FIGS. 4 and 7 calculates the frame timing information and the Gold code (i.e., group ID) information using 64×15 metrics derived from 15 time-shifted versions of each of 16 different Hadamard transform outputs. Such an operation requires a large amount of processing power. However, it is possible to derive the frame timing information and group ID information more easily in secondary search stage 224 by taking advantage of the synchronization detection properties of Comma-Free Reed-Solomon (CFRS) codes used for error correction in receiver 200. Accordingly, an advantageous second and third embodiment of secondary search stage 224 is presented in FIGS. 10 and 11 that uses the synchronization detection properties of Comma-Free Reed-Solomon to reduce the processing complexity of secondary search stage 224.

The use of CFRS codes has been proposed for the 64 codewords with the largest minimum symbol distance, between different cyclic shifts of the same codeword, or between any cyclic shifts of different codewords. For the present invention, in order to obtain these codewords, (15,3) Comma-Free Reed-Solomon (CFRS) coding over Galois field 16 (i.e., GF(16)) is used.

As will be described below in greater detail, the present invention provides a two-step method to invoke synchronization syndromes, Reed-Solomon (RS) decoding, Reed-Solomon error correction, diversity, and threshold comparisons. The processing in the improved secondary search stage 224 may be dividing into two steps. In the first step, the frame timing is acquired through error correction and syndrome computation. In the second step, the frame timing information is used to detect the Gold code group ID.

Figure 10:
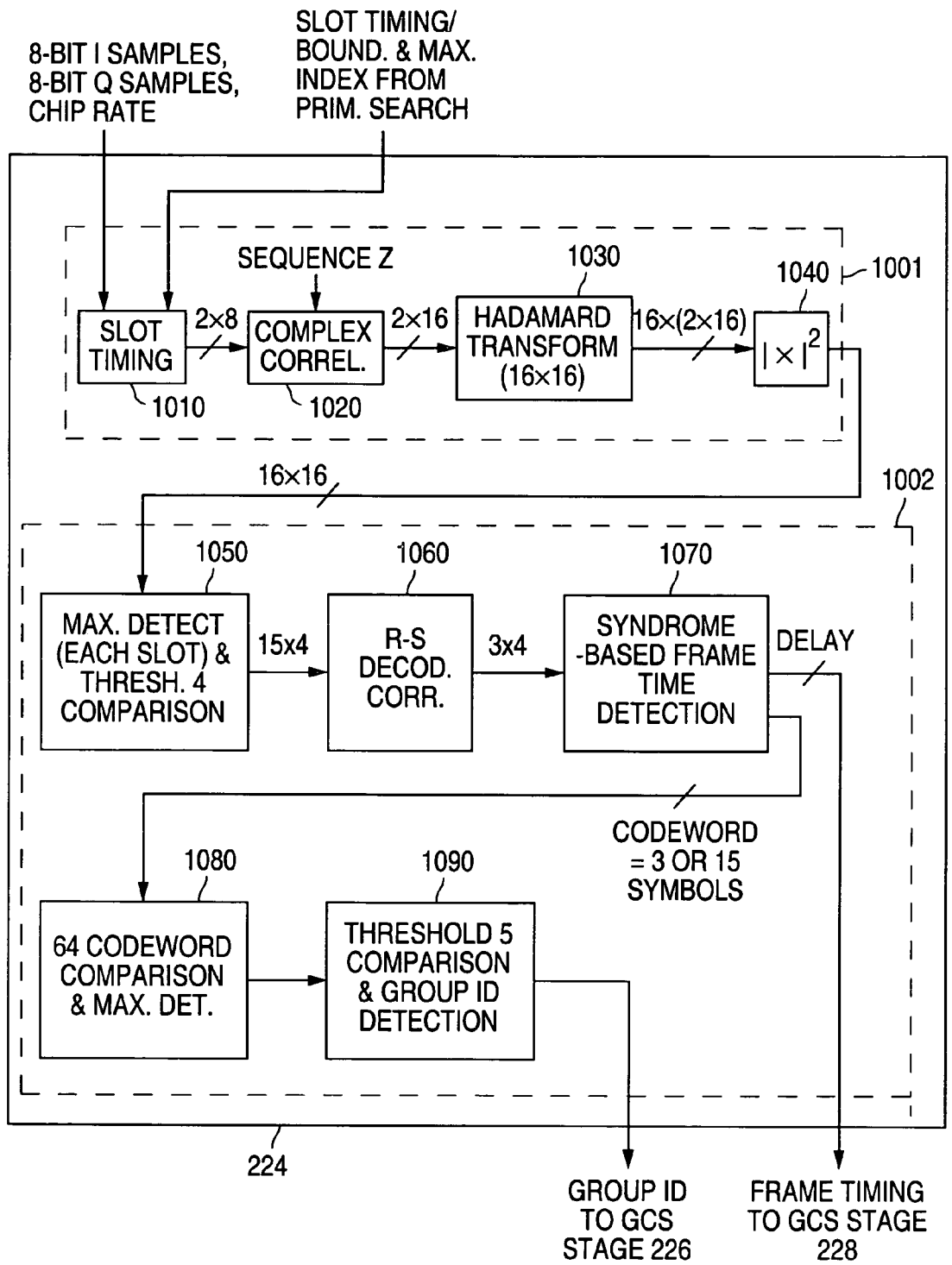
FIG. 10 is a detailed block diagram of the secondary search stage according to second and third exemplary embodiments of the present invention.

FIG. 10 is a detailed block diagram of secondary search stage 224 according to a second and third exemplary embodiment of the present invention. Secondary search stage 224 comprises slot timing block 1010, complex correlator 1020, Hadamard transform block 1030, squaring unit 1040, maximum detection and Threshold 4 comparison block 1050, Reed-Solomon (R-S) decoding correction block 1060, syndrome-based frame time detection block 1070, sixty-four (64) codeword comparison and maximum detection block 1080, and Threshold 5 comparison and group ID detection block 1090. Dotted line boundary 1001 indicates circuit blocks that may be implemented in hardware. Dotted line boundary 1002 indicates circuit blocks that may be implemented in firmware.

Slot timing block 1010 receives the 8-bit in-phase (I) samples and 8-bit quadrature (Q) samples from FIR filter 216 at the chip rate. Doubling sampling is not required since slot timing block 1010 uses the slot timing and Maximum Index information from primary search stage 222 to properly align the received I and Q samples. Next, the I samples and Q samples are correlated by complex correlator 1020 using the 256-bit sequence Z from above. The correlated output comprises 16-bit I signal values and a 16-bit Q signal values.

Next, the 16-bit I and Q signals are processed in Hadamard transform block 1030. Hadamard transform block 430 comprises sixteen separate matched filters for performing the Hadamard transform. As noted above, each of the sixteen Hadamard matched filters search for the slot whose beginning is aligned with the start of a frame. Since there are sixteen (16) Hadamard codes used in the S-SCH signals, sixteen (16) Hadamard matched filters (i.e., correlators) are employed by Hadamard transform block 430. This produces 16 separate 16-bit I signal outputs and 16 separate 16-bit Q signal outputs.

For each of the 16 pairs of 16-bit I and Q signal value from Hadamard transform block 1030, squaring unit 1040 produces the magnitude ($I^2+Q^2$). The outputs of squaring block 1040 are sixteen separate 16-bit values. Correlation with 16 Hadamard codes is repeated for the next 14 slots and the results for all 15 slots are stored in memory in maximum detection and Threshold 4 comparison block 1050. The soft correlation values are accumulated over two frames to alleviate the effect of channel fading using diversity. Thus, maximum detection and Threshold 4 comparison block 1050 contains a 16×15 matrix, where each matrix entry is 16 bits. Each of the 15 columns of the matrix represents one of the 15 slots.

Next, maximum detection and Threshold 4 comparison block 1050 detects the maximum correlation value within each slot (i.e., each matrix column) from one of the 16 possible choices and repeats that for 15 consecutive slots. Maximum detection and Threshold 4 comparison block 1050 also compares each of the maximum correlation values from each slot with Threshold 4. Threshold 4 is computed by scaling the estimated power of the received signal. The scaling factor is obtained such that the false alarm rate is minimized whereas the missing probability is maintained at an acceptable low level for the overall acquisition time.

If the maximum correlation values pass Threshold 4 for more than nine consecutive slots (because up to six errors can be corrected by Reed-Solomon decoding), maximum detection and Threshold 4 comparison block 1050 determines the index of the Hadamard codeword that results in maximum (accumulated) correlation over each of the 15 consecutive slots. Thus, the (15×4) output of maximum detection and Threshold 4 comparison block 1050 is the index of the maximum value in each slot for all 15 slots. Since there are only sixteen entries (0–15) in each slot (i.e., column), the index may be represented by a 4-bit binary value between 0000 and 1111.

If nine or less maximum correlation values pass Threshold 4, an error condition has occurred and maximum detection and Threshold 4 comparison block 1050 resumes processing the outputs of squaring unit 1040 if the delay limit allows.

Reed-Solomon (R-S) decoding correction block 1060 uses 15 consecutive Hadamard indexes to obtain a codeword of length 15 and corrects up to six [i.e., $6=(n-k)/2=(15-3)/2$)] errors by employing Reed-Solomon decoding. The corrected outputs of R-S decoding correction block 1060 are codewords of length 3 (i.e., each codeword contains 3 symbols and each symbol contains a 4-bit index value). Syndrome-based frame time detection block 1070 receives the error-corrected codeword and associates a polynomial of degree 14 to the detected codeword of length 15. The coefficients of this polynomial are members of GF(16).

Next, syndrome-based frame time detection block 1070 determines the number of slots the received codeword is shifted (or delayed) by with respect to the frame boundary. At this point, syndrome-based frame time detection block 1070 has detected the frame boundary. This delay is the frame boundary/timing information that is transmitted to Gold code search stage 226. According to the second embodiment of secondary search stage 224 (as illustrated in FIG. 10), syndrome-based frame time detection block 1070 finds the correct codeword of length 15 corresponding to the codeword of length 3 at the output of R-S decoding correction block 1060 and sends the corrected codeword of length 15 to sixty-four codeword comparison and maximum detection block 1080.

Next, sixty-four codeword comparison and maximum detection block 1080 compares the corrected codeword of length 15 with each of the 64 given CFRS codewords of length 15, each shifted by the amount found in syndrome-based frame time detection block 1070. Sixty-four (64) codeword comparison and maximum detection block 1080 detects the best matching codeword among the 64. Threshold 5 comparison and group ID detection block 1090 compares the number of matches with Threshold 5. Threshold 5 is an integer less than or equal to 15 set to minimize false alarm probability, while not exceeding a specific missing probability. The index of the codeword detected by Threshold 5 comparison and group ID detection block 1090 is the Gold code group ID that is sent to Gold code search (GCS) stage 226.

According to the third embodiment of secondary search stage 224 (as illustrated in FIG. 10), the performance of secondary search stage 224 may be improved with respect to operational complexity by first storing 64×15 constant codewords of length three (3) in the memory of receiver 200. These 960 codewords (i.e., 960=64×15) are derived by decoding all 15 cyclically shifted versions of the 64 given CFRS codewords, using (15,3) Reed-Solomon decoding. This memory consumption is relatively small and yields a reduction in the computational burden of the processor performing the cell search.

Thus, in sixty-four codeword comparison and maximum detection block 1080, the detected three-element codeword is then compared with each of the 64 three-element codewords that correspond to cyclically shifted versions of the given CFRS codewords, each shifted by the amount found by syndrome-based frame time detection block 1070. The best matching codeword among the 64 is detected. The number of matches is compared with Threshold 5. Threshold 5 is an integer smaller than or equal to 3, set to minimize false alarm probability, while not exceeding a specific missing probability. The index of this codeword is the detected gold code group ID.

Figure 11:
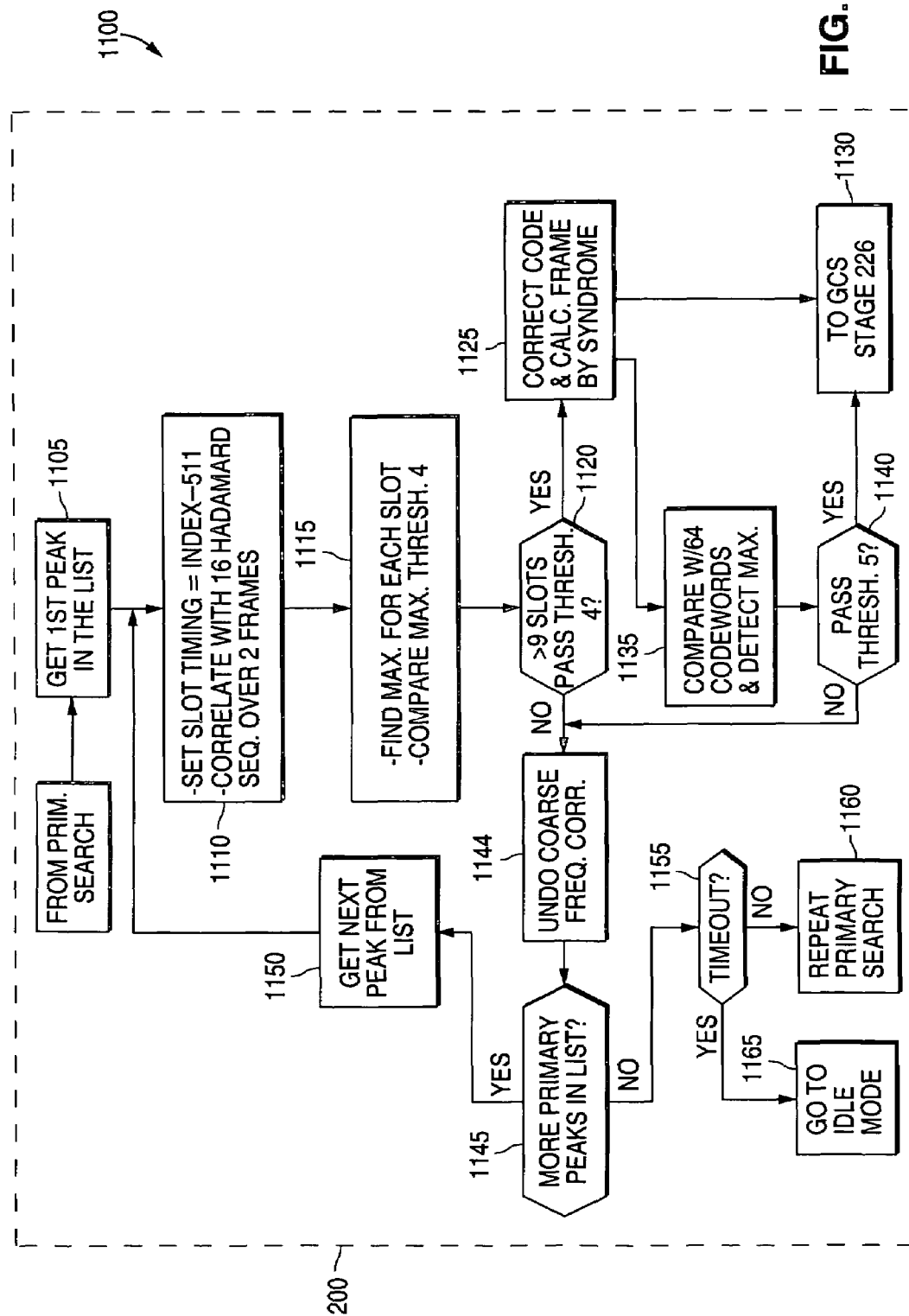
FIG. 11 is a flow diagram illustrating the operation of the secondary search stage according to the second exemplary embodiment of the secondary search stage illustrated in FIG. 10.

FIG. 11 depicts flow diagram 1100, which illustrates the operation of secondary search stage 224 according to the second and third exemplary embodiments of secondary search stage 224 associated with FIG. 10. Once enabled by primary search stage 222 (process step 1105), secondary search stage 224 performs a correlation on the secondary synchronization channel (S-SCH) signal with the 256-bit sequence, z, in Equation 1 above. The correlated output is then correlated with 15-time shifted versions of 16 possible Hadamard sequences (process step 1110). A maximum metric value is then calculated for all (15×16) Hadamard transform outputs. The maximum metric for each slot is compared to Threshold 4 (process step 1115).

If nine or less maximum metrics in fifteen consecutive slots exceed Threshold 4 (process step 1120), a miss condition has occurred and secondary search stage 224 undoes the coarse frequency correction by changing the carrier frequency by the estimated frequency offset derived from the outputs of primary search stage 222, but in the opposite direction (process step 1144). Secondary search stage 224 then determines if there are additional slot peaks from primary search stage 222 (process step 1145). If there are more peaks, secondary search stage 224 gets the next peak from the list (process step 1150) and re-performs correlation with the sequence, z, and the 16 possible Hadamard codes (process steps is 1110). If there are no more peaks in the list, secondary search stage 224 determines if a timeout has occurred (process step 1155). If a time out has occurred, cell search block 220 goes to idle mode (process step 1165). If a time out has not occurred, primary search stage 224 is repeated (process step 1160).

If more than nine maximum metrics in fifteen consecutive slots exceed Threshold 4 (process step 1120), secondary search stage 224 applies R-S code correction and calculates frame timing by invoking the syndrome properties of CFRS codes (process step 1130). The frame timing is sent to Gold code search stage 226 (process step 1130). The detected (or corrected) codeword is then compared to the 64 possible CFRS codewords and the maximum value of the matches is compared to Threshold 5 (process step 1140). If the maximum value exceeds Threshold 5, the corresponding CFRS codeword gives the Gold code group ID, which is sent to Gold code search stage 226.

If the maximum value does not exceed Threshold 5, a miss has occurred and secondary search stage 224 determines if there are additional slot peaks from primary search stage 222 (process step 1145). If there are more peaks, secondary search stage 224 gets the next peak from the list (process step 1150) and re-performs correlation with the sequence, z, and the 16 possible Hadamard codes (process steps 1110). If there are no more peaks in the list, secondary search stage 224 determines if a timeout has occurred (process step 1155). If a time out has occurred, cell search block 220 goes to idle mode (process step 1165). If a time out has not occurred, primary search stage 224 is repeated (process step 1160).

The second and third embodiments of secondary search stage 224 described with respect to FIGS. 10 and 11 make use of the synchronization detectable properties of 64 group ID codes by invoking syndrome generation that reduces the processing burden compared to the soft-decoding algorithm with exhaustive comparisons described in FIGS. 4 and 7. The second and third embodiments of secondary search stage 224 as shown in FIGS. 10 and 11 also employs threshold testing in two steps. This further reduces false alarm probability in secondary search stage 224 compared to an implementation with one or no thresholds. At the same time, the second and third embodiments of secondary search stage 224 as shown in FIGS. 10 and 11 use the error-correction properties of Reed-Solomon codes to reduce the effect of hard decisions in the first step of secondary synchronization signal detection. The third embodiment of secondary search stage 224 described for FIGS. 10 and 11 further exploits R-S error-correction properties to further reduce the number of comparisons from 15 comparisons for each codeword to 3 comparisons for each codeword.

Although the present invention has been described with several embodiments, various changes and modifications may be suggested to one skilled in the art. It is intended that the present invention encompass such changes and modifications as fall within the scope of the appended claims.

What is claimed is:

1. For use in a receiver, a pipelined apparatus for performing cell searches comprising a secondary search stage capable of receiving a secondary synchronization channel (S-SCH) signal comprising one of 64 codewords, wherein each of said 64 codewords comprises a sequence of fifteen slots and each slot comprises one of sixteen valid 256-bit secondary synchronization codes (SSC), said secondary search stage comprising:
    a correlation block for i) correlating said S-SCH signal with a 256-bit sequence z associated with said S-SCH signal to produce a first correlated output sequence and ii) correlating said first correlated output sequence with each one of sixteen Hadamard sequences associated with said S-SCH signal to produce a vector output sequence, where each vector comprises sixteen Hadamard-correlated values, one for said each of said sixteen Hadamard sequences associated with said S-SCH signal;
    a maximum detection block capable of detecting a maximum Hadamard-correlated value in said each vector and generating an index sequence, wherein each index identifies a position of said maximum Hadamard-correlated value in said each vector;
    a Reed-Solomon (R-S) decoding correction block capable of decoding and correcting 15 consecutive indexes in said index sequence and determining a codeword of length 3 associated with said 15 consecutive corrected indexes; and
    a frame time detector capable of receiving said codeword of length 3 from said R-S decoding correction block and determining therefrom frame boundary data of said S-SCH signal based on syndrome properties of an R-S code associated with said S-SCH code.

2. The pipelined apparatus as set forth in claim 1 further comprising a codeword comparison block capable of receiving said codeword of length 3 from said frame time detector, comparing said received codeword of length 3 to 64 stored codewords of length 3, wherein each of said stored codewords of length 3 is associated with one of said 64 codewords associated with said S-SCH signal, and identifying a first stored codeword having a maximum correlation with said received codeword of length 3, wherein said identified first stored codeword determines a group ID of said S-SCH signal.

3. The pipelined apparatus as set forth in claim 1 further comprising a codeword comparison block capable of receiving said 15 consecutive corrected indexes from said frame time detector, comparing said 15 consecutive corrected indexes with 64 stored codewords of length 15, wherein each of said 64 stored codewords of length 15 is associated with one of said 64 codewords associated with said S-SCH signal, and identifying a first stored codeword having a maximum correlation with said received 15 consecutive corrected indexes, wherein said identified first stored codeword determines a group ID of said S-SCH signal.

4. The pipelined apparatus as set forth in claim 2 further comprising a primary search stage capable of receiving a primary synchronization channel (P-SCH) signal and detecting therein a first maximum peak associated with a slot boundary in said P-SCH signal, wherein said primary search stage generates slot timing data from said first maximum peak and sends said slot timing data to said secondary search stage.

5. The pipelined apparatus as set forth in claim 4 further comprising a Gold code search stage capable of receiving i) a common control pilot channel (CPICH) signal, ii) said slot timing data from said primary search stage, and iii) said frame boundary data and said group ID from said secondary search stage and detecting in said CPICH signal a second maximum peak associated with a Gold code of said base station.

6. The pipelined apparatus as set forth in claim 5 wherein said primary search stage operates substantially continuously.

7. The pipelined apparatus as set forth in claim 6 wherein said primary search stage and said secondary search stage operate at least partially simultaneously.

8. The pipelined apparatus as set forth in claim 6 wherein said secondary search stage and said Gold code search stage operate at least partially simultaneously.

9. The pipelined apparatus as set forth in claim 6 wherein said primary search stage, said secondary search stage, and said Gold code search stage operate at least partially simultaneously.

10. The pipelined apparatus as set forth in claim 9 wherein said secondary search stage is enabled by receipt of said slot timing data from said primary search stage.

11. A receiver comprising:
    a radio frequency (RF) front-end capable of receiving an incoming RF signal and down-converting said incoming RF signal to an intermediate frequency (IF) signal, wherein said IF signal comprises a primary synchronization channel (P-SCH) signal, a secondary synchronization channel (S-SCH) signal, and a common control pilot channel (CPICH) signal; and
    a pipelined cell search apparatus capable of receiving said IF signal and detecting base station signals therein, said pipelined cell search apparatus comprising a secondary search stage capable of receiving said S-SCH signal, said S-SCH signal comprising one of 64 codewords, wherein each of said 64 codewords comprises a sequence of fifteen slots and each slot comprises one of sixteen valid 256-bit secondary synchronization codes (SSC), wherein said secondary search stage comprises:
        a correlation block for i) correlating said S-SCH signal with a 256-bit sequence z associated with said S-SCH signal to produce a first correlated output sequence and ii) correlating said first correlated output sequence with each one of sixteen Hadamard sequences associated with said S-SCH signal to produce a vector output sequence, where each vector comprises sixteen Hadamard-correlated values, one for said each of said sixteen Hadamard sequences associated with said S-SCH signal;
        a maximum detection block capable of detecting a maximum Hadamard-correlated value in said each vector and generating an index sequence, wherein each index identifies a position of said maximum Hadamard-correlated value in said each vector;

a Reed-Solomon (R-S) decoding correction block capable of decoding and correcting 15 consecutive indexes in said index sequence and determining a codeword of length 3 associated with said 15 consecutive corrected indexes; and a frame time detector capable of receiving said codeword of length 3 from said R-S decoding correction block and determining therefrom frame boundary data of said S-SCH signal based on syndrome properties of an R-S code associated with said S-SCH code.

12. The receiver as set forth in claim 11 further comprising a codeword comparison block capable of receiving said codeword of length 3 from said frame time detector, comparing said received codeword of length 3 to 64 stored codewords of length 3, wherein each of said stored codewords of length 3 is associated with one of said 64 codewords associated with said S-SCH signal, and identifying a first stored codeword having a maximum correlation with said received codeword of length 3, wherein said identified first stored codeword determines a group ID of said S-SCH signal.

13. The receiver as set forth in claim 11 further comprising a codeword comparison block capable of receiving said 15 consecutive corrected indexes from said frame time detector, comparing said 15 consecutive corrected indexes with 64 stored codewords of length 15, wherein each of said 64 stored codewords of length 15 is associated with one of said 64 codewords associated with said S-SCH signal, and identifying a first stored codeword having a maximum correlation with said received 15 consecutive corrected indexes, wherein said identified first stored codeword determines a group ID of said S-SCH signal.

14. The receiver as set forth in claim 12 further comprising a primary search stage capable of receiving a primary synchronization channel (P-SCH) signal and detecting therein a first maximum peak associated with a slot boundary in said P-SCH signal, wherein said primary search stage generates slot timing data from said first maximum peak and sends said slot timing data to said secondary search stage.

15. The receiver as set forth in claim 14 further comprising a Gold code search stage capable of receiving i) a common control pilot channel (CPICH) signal, ii) said slot timing data from said primary search stage, and iii) said frame boundary data and said group ID from said secondary search stage and detecting in said CPICH signal a second maximum peak associated with a Gold code of said base station.

16. The receiver as set forth in claim 15 wherein said primary search stage operates substantially continuously.

17. The receiver as set forth in claim 16 wherein said primary search stage and said secondary search stage operate at least partially simultaneously.

18. The receiver as set forth in claim 16 wherein said secondary search stage and said Gold code search stage operate at least partially simultaneously.

19. The receiver as set forth in claim 16 wherein said primary search stage, said secondary search stage, and said Gold code search stage operate at least partially simultaneously.

20. The receiver as set forth in claim 19 wherein said secondary search stage is enabled by receipt of said slot timing data from said primary search stage.

21. For use in a receiver, a method for detecting a secondary synchronization channel (S-SCH) signal comprising one of 64 codewords, wherein each of the 64 codewords comprises a sequence of fifteen slots and each slot comprises one of sixteen valid 256-bit secondary synchronization codes (SSC), the method comprising the steps of:

correlating the S-SCH signal with a 256-bit sequence z associated with the S-SCH signal to produce a first correlated output sequence;

correlating the first correlated output sequence with each one of sixteen Hadamard sequences associated with the S-SCH signal to produce a vector output sequence, where each vector comprises sixteen Hadamard-correlated values, one for the each of the sixteen Hadamard sequences associated with the S-SCH signal;

detecting a maximum Hadamard-correlated value in the each vector and generating an index sequence, wherein each index identifies a position of the maximum Hadamard-correlated value in the each vector;

Reed-Solomon (R-S) decoding and correcting 15 consecutive indexes in the index sequence and determining a codeword of length 3 associated with the 15 consecutive corrected indexes; and determining from the codeword of length 3 frame boundary data of the S-SCH signal based on syndrome properties of an R-S code associated with the S-SCH code.

22. The method as set forth in claim 21 further comprising the steps of:

comparing the received codeword of length 3 to 64 stored codewords of length 3, wherein each of the stored codewords of length 3 is associated with one of the 64 codewords associated with the S-SCH signal; and identifying a first stored codeword having a maximum correlation with the received codeword of length 3, wherein the identified first stored codeword determines a group ID of the S-SCH signal.

23. The method as set forth in claim 22 further comprising the steps of:

comparing the 15 consecutive corrected indexes with 64 stored codewords of length 15, wherein each of the 64 stored codewords of length 15 is associated with one of the 64 codewords associated with the S-SCH signal, and identifying a first stored codeword having a maximum correlation with the received 15 consecutive corrected indexes, wherein the identified first stored codeword determines a group ID of the S-SCH signal.

* * * * *

UNITED STATES PATENT AND TRADEMARK OFFICE
CERTIFICATE OF CORRECTION

PATENT NO.        : 7,095,811 B1                                              Page 1 of 1
APPLICATION NO. : 10/232851
DATED             : August 22, 2006
INVENTOR(S)      : Mohammad Reza Shikh-Bahaei, Karim Nassiri-Toussi and Ali D. Pirooz It is certified that error appears in the above-identified patent and that said Letters Patent is hereby corrected as shown below:

Column 8, line 20, delete "is".

Signed and Sealed this

Third Day of April, 2007

JON W. DUDAS
*Director of the United States Patent and Trademark Office*